United States Patent
Johnson et al.

[19]

[11] Patent Number: 6,031,472
[45] Date of Patent: Feb. 29, 2000

[54] ENCODING/DETECTION METHOD FOR DIGITAL DATA TRANSMITTER WITH A SIGNAL HAVING MULTIPLE LEVELS

[75] Inventors: Howard W. Johnson, Woodinville, Wash.; Martin H. Graham, Berkeley, Calif.

[73] Assignee: And Yet, Inc., Berkeley, Calif.

[21] Appl. No.: 09/024,883

[22] Filed: Feb. 17, 1998

Related U.S. Application Data

[63] Continuation-in-part of application No. 08/899,220, Jul. 23, 1997.

[51] Int. Cl.$^7$ ........................................ H03M 5/14
[52] U.S. Cl. ................................................ 341/58
[58] Field of Search ................................ 341/58, 59, 106, 341/95, 68; 375/242

[56] References Cited

U.S. PATENT DOCUMENTS

5,870,040  2/1999  Ando ........................................ 341/106
5,892,467  4/1999  Kim ........................................... 341/59

*Primary Examiner*—Brian Young
*Attorney, Agent, or Firm*—Blakely, Sokoloff, Taylor & Zafman LLP

[57] ABSTRACT

An encoding/decoding method for a signal having at least two different positive and negative levels. Each symbol representing, for instance, two binary bits is encoded in each symbol period. During each symbol period, the encoded signal transitions between a level of one polarity to a level in the opposite polarity. The levels and transitions are selected so that there is no DC component. The frequency spectrum is shifted away from the lower frequencies with this encoding.

5 Claims, 9 Drawing Sheets

ENCODING/DETECTION METHOD FOR DIGITAL DATA TRANSMITTER WITH A SIGNAL HAVING MULTIPLE LEVELS

This is a Continuation-in-Part application of U.S. Ser. No. 08/899,220, filed Jul. 23, 1997.

BACKGROUND OF THE INVENTION

1. Field of the Invention

The invention relates to the field of digital data encoding and decoding.

2. Prior Art

Some digital data encoding techniques use three signal levels to encode two digital states. For instance, Biphase encoding uses a zero (intermediate) signal level to represent a binary 0 and a combination of both positive (high) and negative (low) signals to represent a binary 1. This achieves the absence of any DC component independent of the data. However, since binary 0's are represented by a constant intermediate signal, no timing information is transmitted during periods where the data consists of consecutive 0's.

In contrast, the Return-To-Zero Alternate Mark Inversion (RZ-AMI) encoding is the bipolar format used in the "T1" standard and implements a slightly different scheme. Similar to Biphase encoding, RZ-AMI uses a zero signal level to represent a binary 0. A binary 1 is represented by a method of alternating high and low signals, which will later be shown, and alternating polarities. Here again, there are no DC components independent of the data and timing information is not transmitted during periods of consecutive 0's.

Another three level encoding scheme is the Non-Return-To-Zero Alternate Mark Inversion (NRZ-AMI). As in Biphase and RZ-AMI, NRZ-AMI uses a zero signal level to represent a binary 0. A binary 1 is represented by a signal alternating between either remaining high or low for an entire bit interval. Similar to RZ-AMI encoding, upon the occurrence of a binary 1, NRZ-AMI encoding is alternated to achieve the elimination of DC components independent of the data. Nevertheless, NRZ-AMI encoding also fails to transmit timing information during periods of consecutive 0's.

One common method of decoding digital signals is based on determining whether the amplitude of the signal is above or below predetermined cut-levels. Cut-levels are simply threshold voltages determined by the system designer. In a three-level system (e.g. Biphase), two cut-levels are necessary. For example, when decoding a Biphase signal, if the signal is above the upper predetermined cut-level, or below the lower predetermined cut-level, the result is a binary 1. If the signal is between the two cut-levels, the result is a binary 0.

The problem with this method becomes apparent when long strings of binary 0's are encoded. During this time, the signal remains at approximately a zero level. This results in extended periods of no timing information being transmitted and consequently shifted bit intervals. One way to remedy this problem is commonly known as "stuffing."

"Stuffing" requires an entirely different decoding scheme based on the location of, and time equivalent distance (TED) between, the maxima and minima in the signal (rather than the magnitude of the amplitude). Maxima occur when the slope of the signal changes from positive to negative and minima occur when the slope changes from negative to positive. By ascertaining the location of the maxima and minima in the signal, and the TED between them, various "modes" may be engaged as described in the DETAILED DESCRIPTION OF THE PRESENT INVENTION section. The end result is the transmittal of timing information, even during strings of binary 0's.

The properties of these systems as well as others, are discussed in *Digital Communication—Second Edition*, by Edward A. Lee and David G. Messerschmitt, published by Kluwer Academic Publishers (1994) particularly in Chapter 12 entitled: "Spectrum Control". Additional information pertaining to these systems may be found in *Digital Transmission Systems*, by David R. Smith, published by Van Norstrand, Reinhold Company (1985) particularly in Chapter 5 entitled: "Baseband Transmission".

Due to distortion and attenuation, digital signals are often altered during transmission. One common undesirable result is baseline wander wherein the decoded signal's zero level begins to drift above or below the actual zero level. One solution to this problem, employed by Biphase encoding, is to utilize a pulse shape having a zero integral.

Another design consideration regarding signal distortion and attenuation is the essential high frequency ($f_{high}$). This is the number of cycles per second for a series of all 1's. For Biphase encoding, $f_{high}$=bits per second, whereas for NRZ-AMI and RZ-AMI encoding, $f_{high}$=(bits per second) 2; half the bandwidth required for Biphase encoding.

Other design considerations include whether the chosen encoding method is "self-equalizing"—the tail of the positive-going pulse is effectively canceled by the tail of the negative-going pulse—and the degree to which timing recovery can be simplified. Biphase encoding is "self-equalizing" and since there is a zero crossing in every 1 bit interval, timing recovery is made easy when there are no periods of consecutive 0's. Despite these advantages, and for the same reasons they exist, Biphase encoding requires about twice the bandwidth as NRZ-AMI or RZ-AMI encoding.

As will be seen, the present invention not only provides the advantages of "self-equalization" and simplified timing recovery regardless of the bit pattern, but also is even more effective in reducing baseline wander than Biphase encoding. This is true because the tail of a signal employing the present invention is inherently shorter than the tail of a signal encoded via Biphase.

Another aspect of the present invention relates to extending the present invention to a class of signals having multiple levels in both the positive and negative polarities. This results in an improvement on the prior art encoding shown for instance, in the text *Digital Communications* by Lee and Messerschmitt (2nd edition) on page 182. This will be discussed in conjunction with FIG. 7.

SUMMARY OF THE INVENTION

A method for encoding symbols, each occurring during a symbol interval, into a signal having at least two different levels of a first polarity and at least two different levels of an opposite polarity to the first polarity is described. First a symbol signal is received representing successive symbols to be encoded or transmitted. Then the signal to be transmitted is generated by encoding a signal for each successive signal which transitions at least once between one of the levels of the first polarity to one of the levels of the opposite polarity, or between one of the levels of the opposite polarity to one of the levels of the first polarity. The transitions and the levels are selected such that the resultant signal for each symbol time has substantially no direct current component.

DETAILED DESCRIPTION OF THE PRESENT INVENTION

A method for encoding and decoding binary data is described. In the following description, numerous well-known circuits and techniques are not described in detail in order to avoid unnecessarily obscuring the present invention. In other instances, specific waveforms and circuits are provided in order to provide a thorough understanding of the present invention. It will be apparent, however, to one skilled in the art that the present invention may be practiced without these specific details.

Two methods of employing the present invention are the "cut-level" method and the "time-equivalent-distance-between-maxima and minima" method, both of which are introduced in the Prior Art section above, and discussed in further detail below. The intricacies of both embodiments are discussed in detail below.

Figure 1:
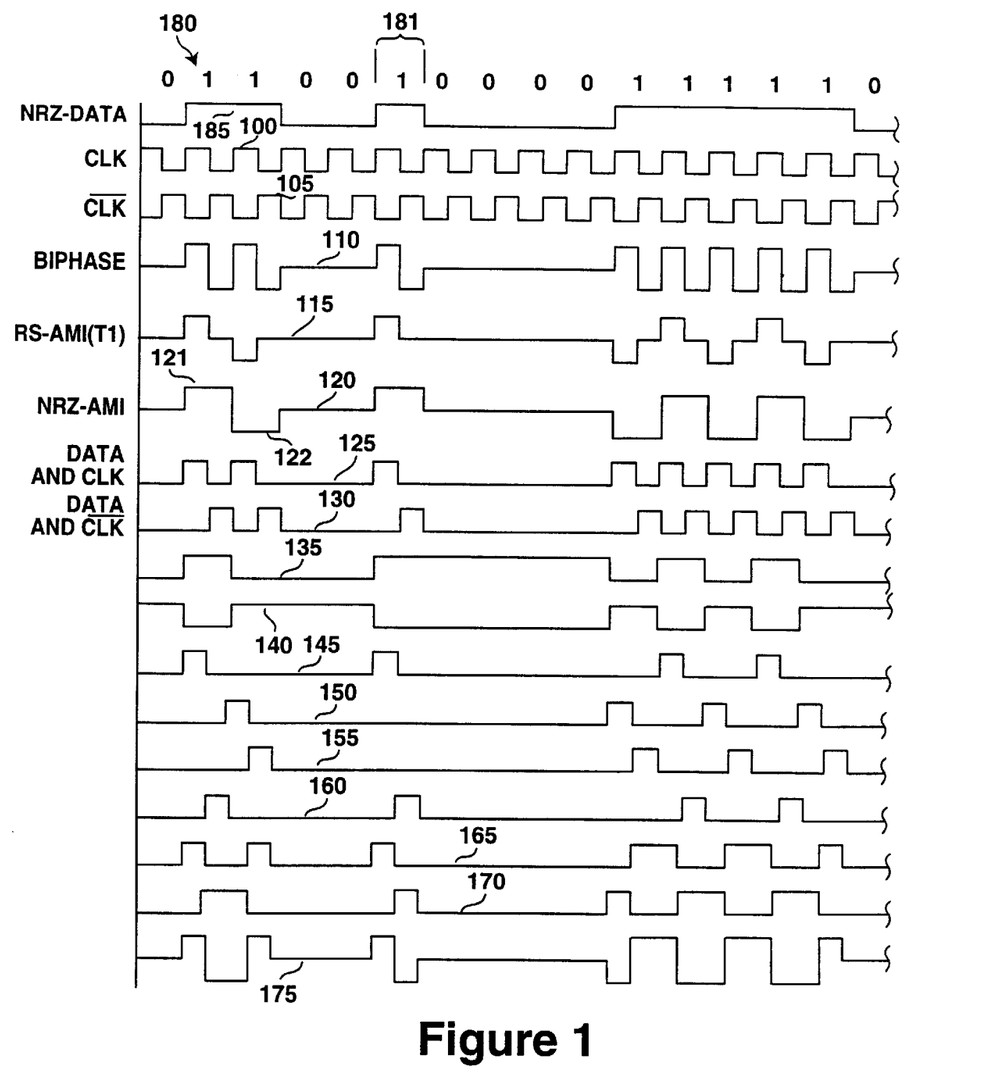
FIG. 1 illustrates a plurality of signals used to describe the prior art and one embodiment of the present invention as well as the behavior of a signal, for a given bit stream, at various stages in the circuitry illustrated in FIG. 2.

Referring first to the "cut-level" embodiment, FIG. 1 illustrates a bit stream 180 of digital data is represented by zeros and ones. Several of the waveforms below bit stream 180 illustrate various methods of encoding the data represented by the bit stream 180 while other waveforms illustrate the behavior of a signal, representing the bit stream 180, at various stages of the circuitry in FIG. 2.

Waveform 100 represents a clocking signal with a period equal to the bit interval 181 shown for the various waveforms of FIG. 1. Waveform 105 is the complement of this clocking signal. The bit stream 180 is represented by waveform 185 using the well-known encoding method Non-Return-To-Zero (NRZ). This waveform has two levels: the lower level indicating a binary 0 and the upper level a binary 1.

Waveform 110 illustrates Biphase encoding, another well-known encoding scheme, wherein three discrete signal levels are used: a zero (intermediate) level, a positive (high) level and a negative (low) level. A binary 1 is represented by a sequence of the positive and negative levels while a binary 0 is represented by the zero level. With this encoding, a transition occurs with each binary 1 at which time the signal is positive for half of a bit interval 181, negative for the other half. As a result, the DC component is eliminated.

The NRZ-AMI waveform 120 represents a binary 1 by either a positive or negative level while a binary 0 is represented by the zero level. The NRZ-AMI waveform 120 transitions with each binary 1 and the positive and negative levels are alternated to avoid a DC component in the signal. By way of example, the first two binary ones of the bit stream 180 cause a transition to the positive level 121 and then to the negative level 122.

The RZ-AMI waveform 115, used in the well-known "T1" carrier system, is different from the NRZ-AMI waveform 120 only in that, for the case of a binary 1, it shifts back to a zero state midway through a bit interval 181 and remains there for approximately the duration of the bit interval 181.

The present invention combines both the Biphase characteristic of occupying two levels per bit interval and the alternating polarity characteristic of the AMI waveforms 115 and 120. Encoding employing the present invention is illustrated by a waveform 175.

To represent a binary 1, encoding via the present invention behaves similarly to a Biphase representation 110 in that the present invention sustains a positive level for approximately the first half of the bit interval 181, shifting to a negative level for approximately the second half of the bit interval 181. However, unlike Biphase encoding 110, encoding by way of the present invention alternates between a high then low level and a low then high level. This alternating is illustrated by the two consecutive ones 176 and the series of consecutive ones 177 in the bit stream 180.

Figure 2:
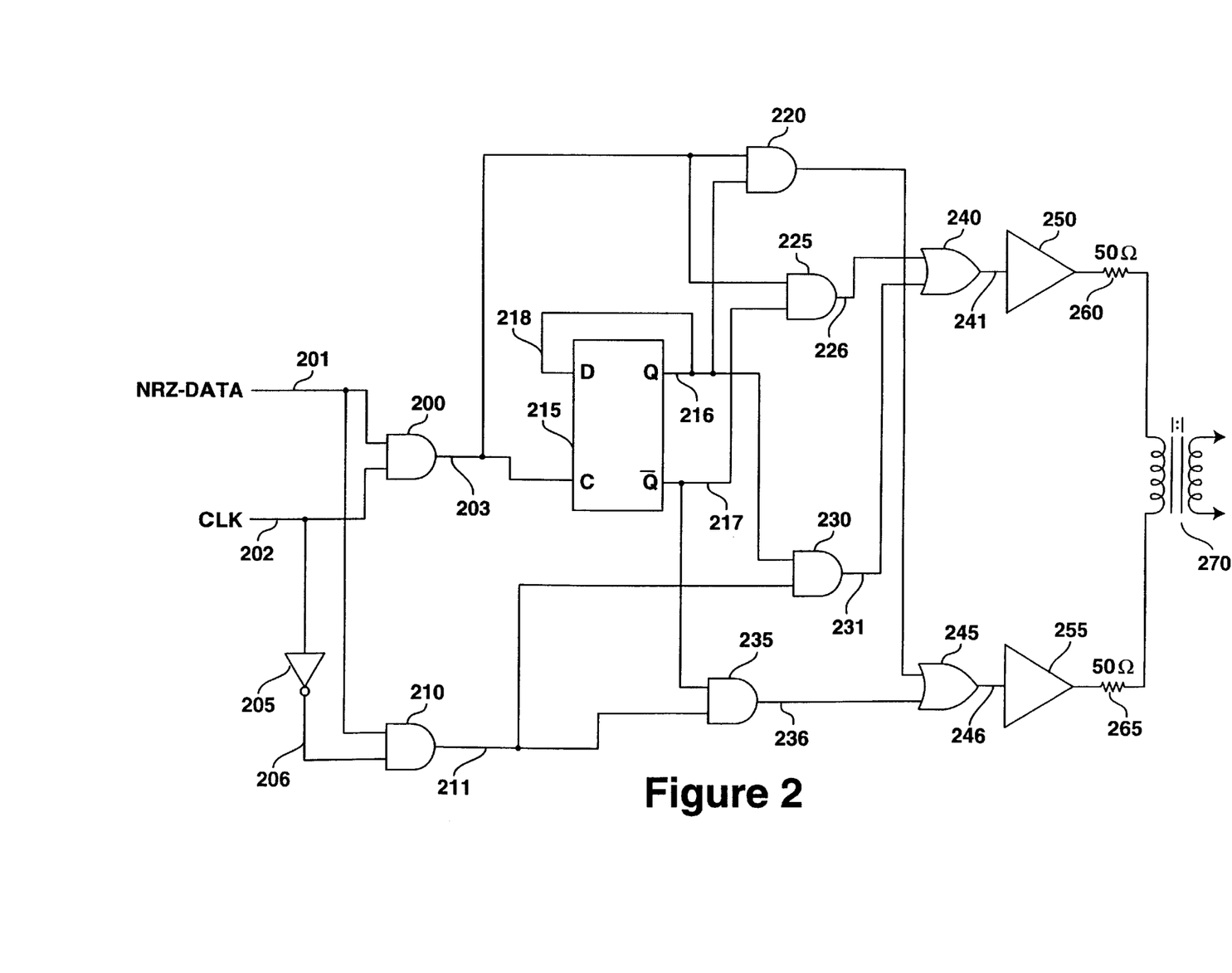
FIG. 2 illustrates an electrical schematic showing one embodiment of an encoder of the present invention.

A circuit for providing the waveform 175 is illustrated in FIG. 2. The data represented by waveform 185 is coupled by line 201 to an input terminal of two AND gates 200 and 210. The clocking signal represented by waveform 100 is coupled by a line 202 to the other input terminal of the AND gate 200 and to the input terminal of an inverter 205. Waveform 105 represents the signal at the output 206 of the inverter 205.

Waveform 125 represents the signal at the output 203 of AND gate 200. This output 203 is coupled to one input terminal of AND gates 220 and 225 as well as the clock terminal of flip-flop 215. Waveform 130 represents the signal at the output 211 of AND gate 210. This output 211 is coupled to an input terminal of AND gates 230 and 235.

Waveform 135 represents the signal at the Q terminal 217 of flip-flop 215. The Q terminal is coupled to the other input terminals of AND gates 225 and 235. Waveform 140 represents the signal at the Q-bar terminal 216 of flip-flop 215. The Q-bar terminal 216 is coupled to the D terminal 218 and to the other inputs of AND gates 220 and 230. The connection between the Q-bar terminal 216 of flip-flop 215 and the D terminal 218 of flip-flop 215 assures that the positive going and negative going transitions from the zero level alternate.

Waveform 150 represents the signal at the output 221 of AND gate 220. This output 221 is coupled to one input of an OR gate 245. Waveform 145 represents the signal at the output 226 of AND gate 225. This output 226 is coupled to one input of an OR gate 240.

Waveform 155 represents the signal at the output 231 of AND gate 230. This output 231 is coupled to the other input of OR gate 240. Waveform 160 represents the signal at the output 236 of AND gate 235. This output 236 is coupled to the other input of OR gate 245.

Waveform 165 represents the signal at the output 241 of OR gate 240. This output 241 is coupled to the input of a buffer 250 which is in turn coupled serially to a 50Ω resistor 260, in turn coupled to a transformer 270. The transformer 270 has a ratio of 1:1. Waveform 170 represents the signal at the output 246 of OR gate 245. This output 246 is coupled to the input of another buffer 255 which is in turn coupled serially to another 50Ω resistor 265, in turn coupled to transformer 270. Waveform 175, one embodiment of the present invention, is the analog difference between outputs 241 and 246.

It should be noted that for the particular positive and negative transitions shown in waveform 175, it is assumed that the flip-flop 215 is in the state shown. However, this is really not significant since if the flip-flop 215 were in its other state, the waveform 175 would simply be reversed; that is, all the positive pulses would become negative pulses, and all the negative pulses would become positive pulses.

Figure 3:
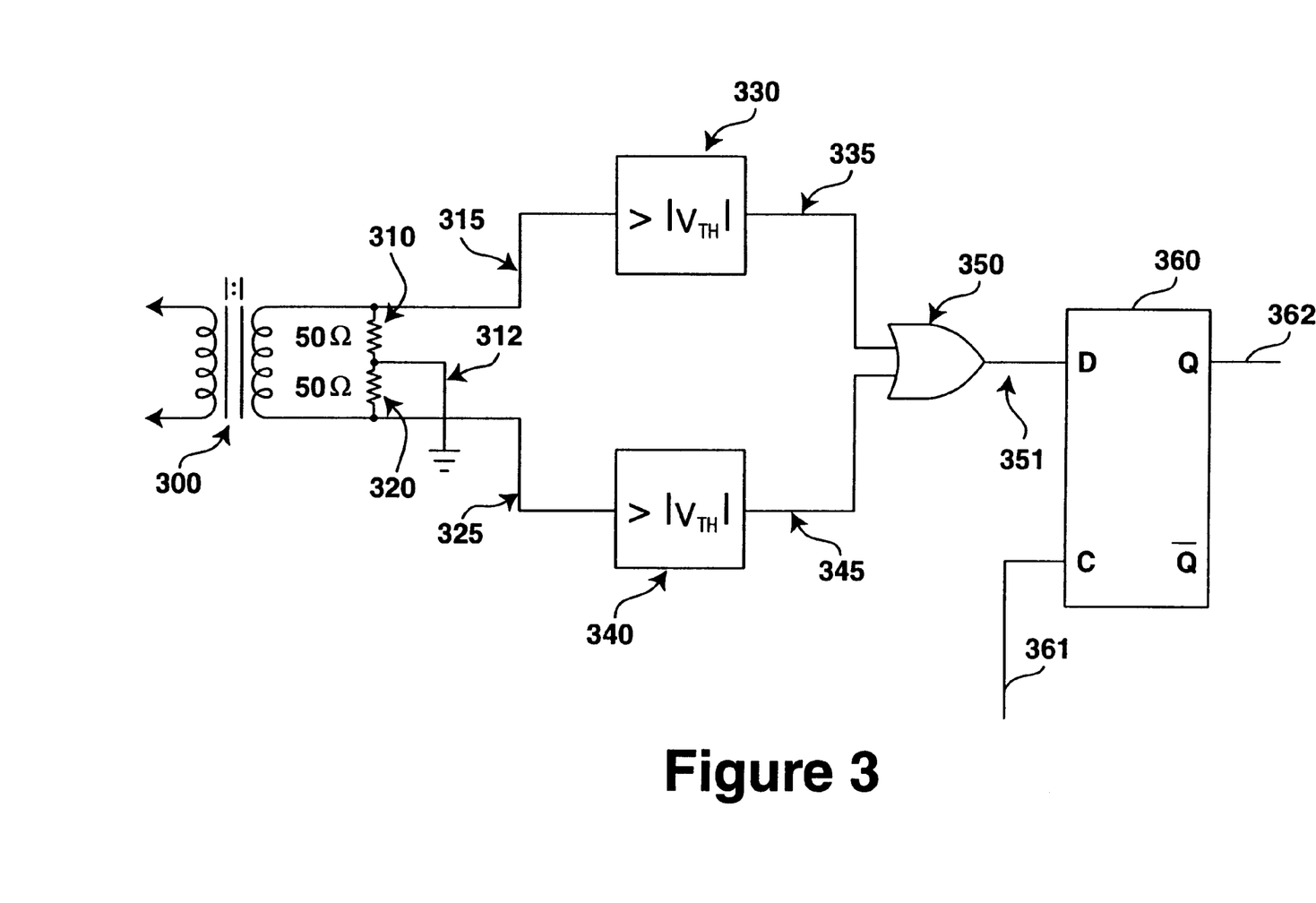
FIG. 3 illustrates an electrical schematic showing one embodiment of a decoder of the present invention.

FIG. 3 depicts the "cut-level" method circuitry for decoding a signal encoded via the present invention. A transformer 300 is coupled, in parallel, to two 50Ω resistors 310 and 320 having a grounded line 312 between them. Consequently, positive voltages will appear on line 315 while negative voltages will appear on line 325. Lines 315 and 325 are coupled to comparators 330 and 340 respectively. These comparators 330 and 340 have internal buffers and will yield a binary 1 output if the absolute value of the input voltage is above a predetermined threshold voltage. The outputs 335 and 345 are coupled to the input terminals of an OR gate 350 such that if the signal being decoded is above the absolute value of the predetermined threshold voltage, the output 351 of OR gate 350 will be high. This output 351 is coupled to the D terminal of a flip-flop 360. The clock terminal of flip-flop 360 receives a signal from a local receive clock (such as derived from a phase locked loop clock recovery circuit) wherein the positive edge of the clock signal is synchronized with the sampling time. This yields an NRZ signal at the output 362 of flip-flop 360.

Figure 4:
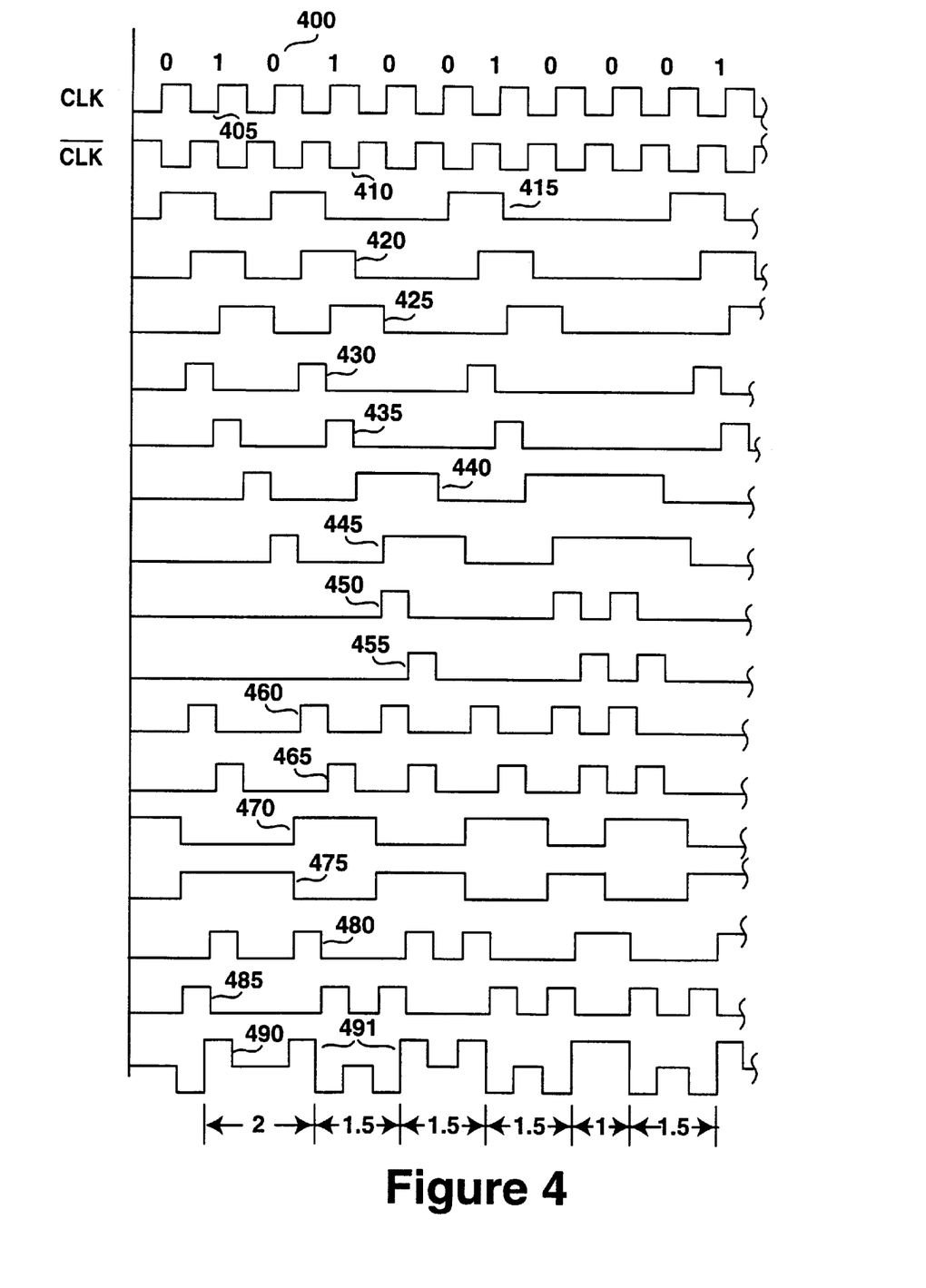
FIG. 4 illustrates a plurality of signals used to describe the behavior of a signal, for a given bit stream, at various stages in the circuitry illustrated in FIG. 5.

As discussed in the Prior Art section, retrieval of timing information when decoding strings of binary 0's can be accomplished by employing a "stuffing" technique during encoding. This "stuffing" technique anticipates two consecutive binary 0's. Upon their occurrence, a signal comparable to that used to encode a binary 1 is generated with its maxima (or minima) located on the line between the two binary 0 bit intervals as illustrated in FIG. 4. The "stuffing" technique complements the present invention in an embodiment referred to herein as the "time-equivalent-distance-between-maxima and minima." It should be noted that the polarity of the "stuffing" signal and that of a binary 1 is alternated between 491 as illustrated in FIG. 4.

The respective decoding scheme can be described as follows: In an initial mode, when the TED between consecutive maxima and minima is equal to one bit interval, this indicates a binary 1; when the TED is equal to two bit intervals, this indicates the binary string 101; when the TED is equal to one and one-half bit intervals, this indicates two consecutive binary 0's and consequently shifts the system to an alternate mode. While in this alternate mode, when the TED is equal to one bit interval, this indicates a binary 0; when the TED is equal to one and one-half bit intervals, this indicates a binary 1 and consequently shifts the system back to the initial mode.

Figure 5:
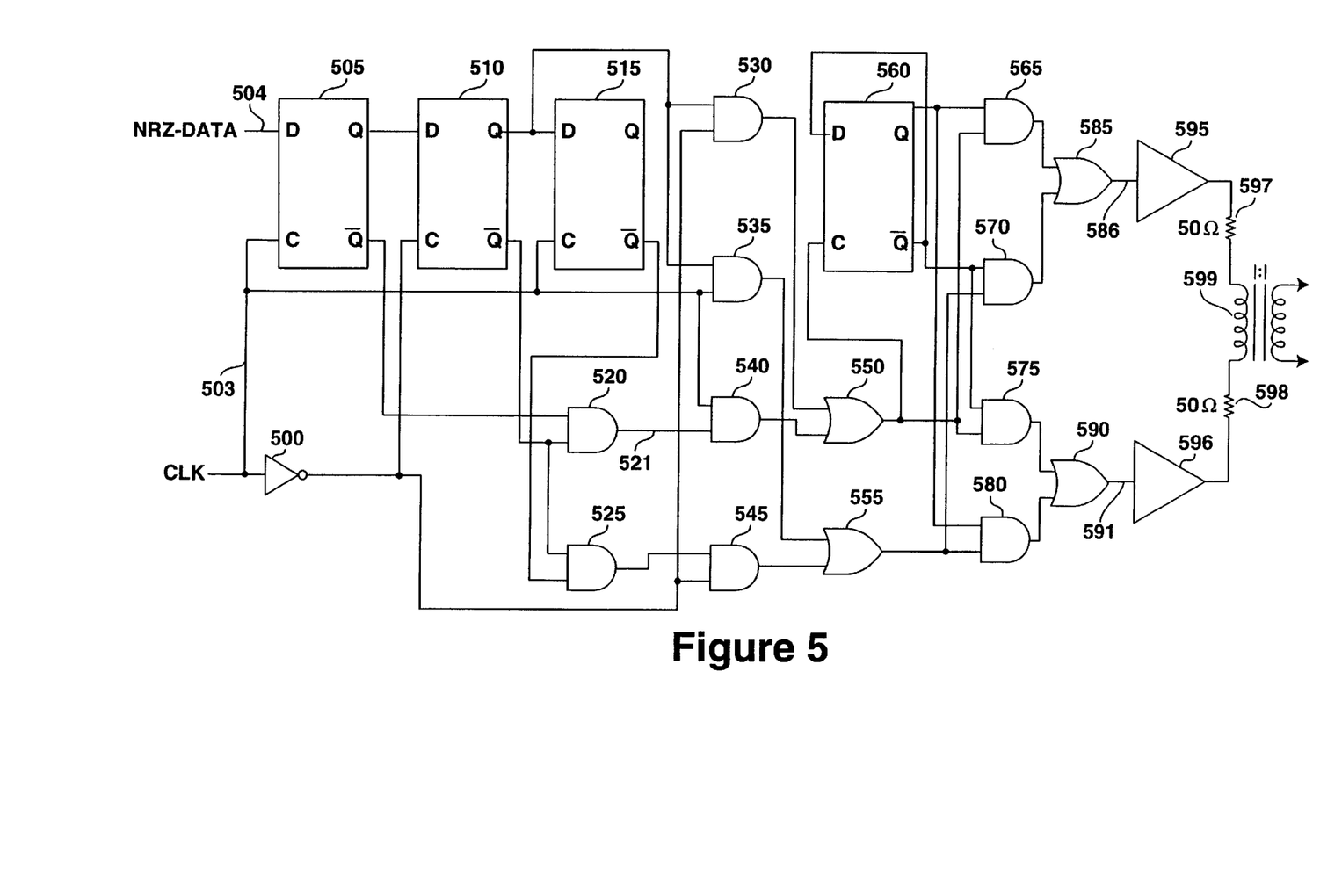
FIG. 5 illustrates an electrical schematic showing an alternate embodiment of an encoder of the present invention.

Referring to FIG. 4, a bit stream 400 of digital data is represented by zeros and ones. The bit stream 400 is represented by the waveform 420 using the NRZ encoding method. Waveforms 405 and 410 illustrate a clock signal and its complement respectively. The other waveforms below bit stream 400 illustrate the signal representing bit stream 400 at various stages of the circuitry in FIG. 5. A circuit for providing the waveform 490, an alternate embodiment of the present invention, is illustrated in FIG. 5. The data represented by waveform 420 is coupled by a line 504 to a D terminal of a flip-flop 505. The clocking signal represented by waveform 405 is coupled by a line 503 to the clock terminal of flip-flop 505, the input of an inverter 500, the clock terminal of a flip-flop 515, one of the input terminals of an AND gate 535, and one of the input terminals of an AND gate 540. Waveform 410 represents the signal at the output of inverter 500 which is coupled to the clock terminal of a flip-flop 510, one of the input terminals of an AND gate 530, and one of the input terminals of an AND gate 545.

Whereas the Q terminal of flip-flop 510 provides the data as synchronized with waveform 490, flip-flop 505 anticipates the upcoming bit—a function necessary to employ the "stuffing" technique discussed above—as illustrated by a waveform 415 in FIG. 4. Similarly, flip-flop 515 generates a delayed signal, illustrated by waveform 425 in FIG. 4, also necessary to employ the "stuffing" technique. Consequently, the Q-bar terminal of flip-flop 505 is coupled to one input terminal of an AND gate 520, the Q-bar terminal of flip-flop 510 is coupled to the other input of AND gate 520 as well as to one of the input terminals of an AND gate 525, and the Q-bar terminal of flip-flop 515 is coupled to the other input terminal of AND gate 525. Further, the Q terminal of flip-flop 505 is coupled to the D terminal of flip-flop 510 and the Q terminal of flip-flop 510 is coupled to the D terminal of flip-flop 515 as well as the other input terminal of AND gate 530 and the other input terminal of AND gate 535.

The output terminal of AND gate 530 is coupled to one of the input terminals of an OR gate 550 and the output terminal of AND gate 535 is coupled to one of the input terminals of an OR gate 555. Waveforms 430 and 435 represent the signal at the output terminals of AND gates 530 and 535 respectively. The output terminal 521 of AND gate 520 is coupled to the other input terminal of AND gate 540 and it should be noted that when output terminal 521 is high, this is an indication that two consecutive binary 0's are being encoded. The output terminal of AND gate 525 is coupled to the other input terminal of AND gate 545. The output terminal of AND gate 540 is coupled to the other input terminal of OR gate 550 and the output terminal of AND gate 545 is coupled to the other input terminal of OR gate 555. Waveforms 440, 445, 450, and 455 represent the signal at the output terminals of AND gates 520, 525, 540, and 545 respectively.

A flip-flop 560 provides the alternating polarity characteristic of the signal and receives the output signal from OR gate 550 at its clock terminal. The output from OR gate 550 also is coupled to both one input terminal of an AND gate 575 and one input terminal of an AND gate 565. The Q-bar terminal of flip-flop 560 is coupled both as a feedback its own D terminal and to one input terminal of AND gates 570 and 575. The output terminal of AND gate 555 is coupled to the other input terminal of AND gate 570 and one input terminal of an AND gate 580. The Q terminal of flip-flop 560 is coupled to the other input terminals of AND gates 565 and 580. Waveforms 460 and 465 represent the signal at the output terminals of OR gates 550 and 555 respectively while waveforms 470 and 475 represent the signal at the Q and Q-bar terminals of flip-flop 560 respectively.

The output terminals of AND gates 565 and 570 are coupled to one and the other input terminals of OR gate 585. Similarly, the output terminals of AND gates 575 and 580 are coupled to one and the other input terminals of OR gate 590. The output terminals 586 and 591 of OR gates 585 and 590 are coupled to the input terminals buffers 595 and 596 respectively, which are in turn respectively coupled to resistors 597 and 598, both with a resistance of 50Ω. Resistors 597 and 598 are coupled to a transformer 599 which has a ratio of 1:1. Waveforms 480 and 485 represent the signal at the output terminals of OR gates 585 and 590 respectively while waveform 490, an alternate embodiment of the present invention, is the analog difference between these two signals 480 and 485. The TED's 495 for waveform 490 are illustrated immediately below waveform 490.

Figure 6:
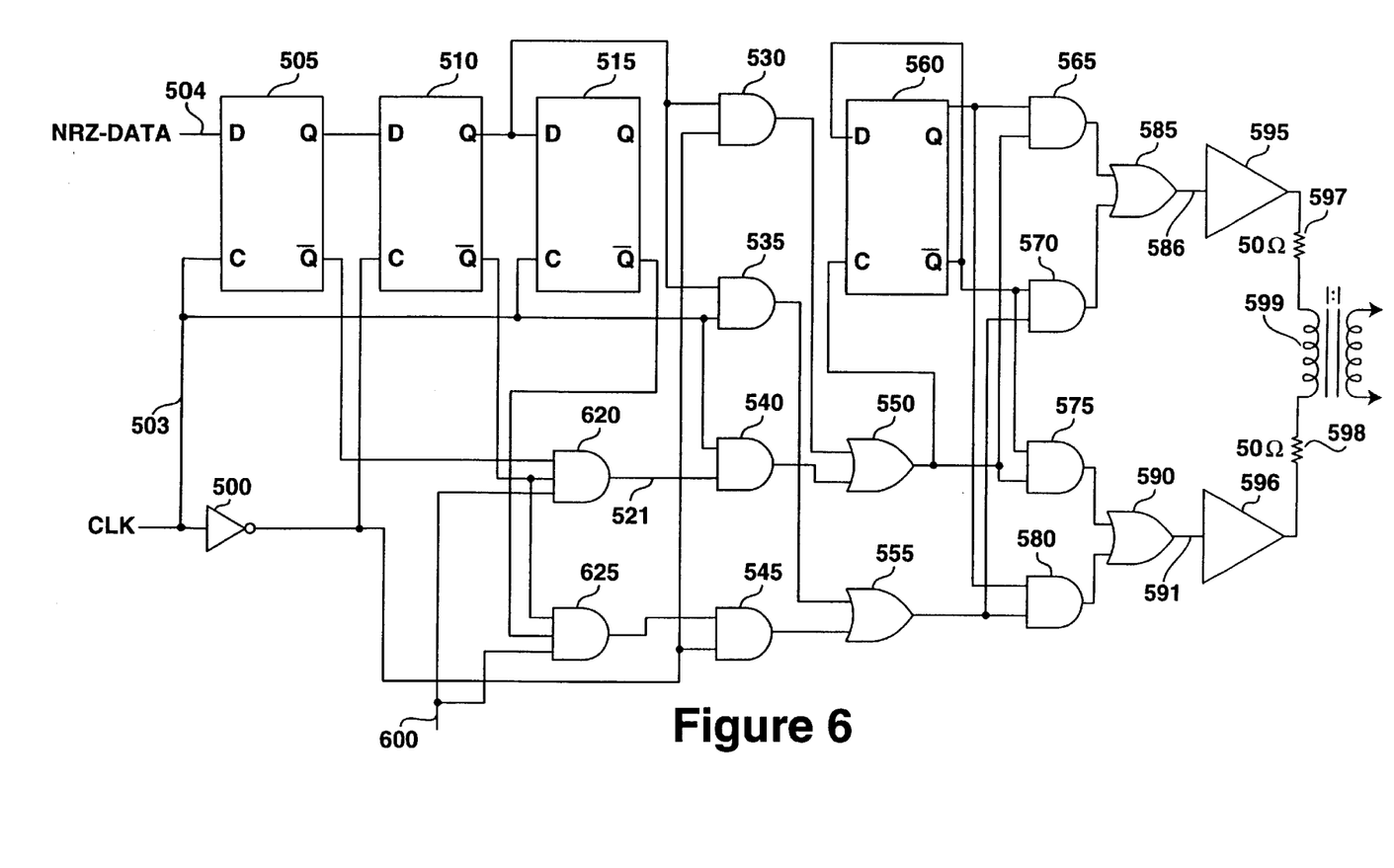
FIG. 6 illustrates an additional embodiment of an encoder of the present invention.

As described above, it's not possible for the TED to be equal to two bit intervals while in the alternate mode. However, if the application calls for a additional mode, this may be achieved by making the adaptations illustrated in FIG. 6. FIG. 6 is identical to FIG. 5 except for the fact that AND gates 620 and 625 have three input terminals wherein one input terminal from each AND gate 620 and 625 is coupled together to form a single terminal 600. The single terminal 600 makes possible an additional mode as explained below. As long as the single terminal 600 is kept at a high level, the circuit will toggle between the initial mode and the alternate mode as described above. However, when the single terminal 600 is at a low level, the circuit operates comparably to that of the first embodiment described above—i.e. the "stuffing" technique is not employed. Thus when the TED between maxima and minima is equal to two and one-half or more bit intervals, the decoder will recognize that the additional mode has been engaged. This additional mode may be used, for example, as an additional control character.

EMBODIMENT OF FIGS. 7 & 8

Figure 7:
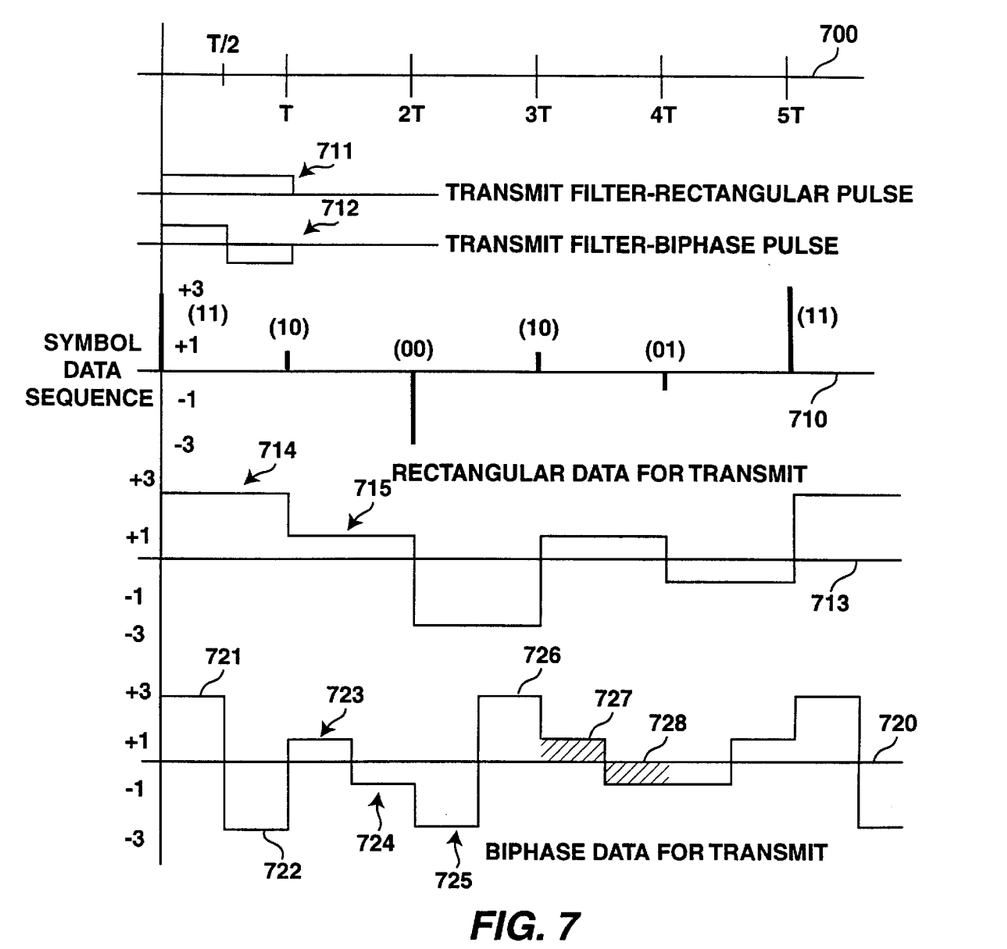
FIG. 7 illustrates a plurality of signals used to describe the prior art and an embodiment of the present invention where a signal having multiple positive and negative levels is used.

In FIG. 7 as will be seen, the present invention is extended to cover encoding of digital data into a signal having at least two different positive levels and two different negative levels. The circuitry previously discussed along with the decoding/detection techniques previously discussed may be used to implement this embodiment as will be apparent to one skilled in the art.

First for purposes of understanding the embodiment of FIG. 7, time is divided into a plurality of symbol times as shown on line 700, each symbol time is represented by the period "T". On line 710 a plurality of symbols are shown which are to be encoded into a signal for transmission, or the like. For purposes of discussion, a signal having two different positive levels and two different negative levels is described.

As shown on line 710, a signal (pulse) of level +3 is used to represent the binary bits (11). Similarly a signal of +1 represents the binary bits (10), a signal of −3 represents the binary bits (00) and the signal of −1 represents the binary bits (01). Note the specific sequence of symbols shown on line 710 which are to be encoded represents the binary bits 1,1, 1,0, 0,0, 1,0, 0,1, 1,1. Symbols representing more than two binary bits of course can be used where more positive and negative levels are used.

In the prior art the symbols shown on line 710 can be encoded for transmission by using a transmit filter having the characteristics generally shown by response 711. This is discussed in the text *Digital Communications,* 2nd Edition by Lee and Messerschmitt at page 182. The resultant encoded waveform is shown on line 713. Each of the symbols shown on line 710 results in a rectangular waveform having a period equal to the symbol period of line 700 and an amplitude equal to the amplitude of the symbol shown on line 710. As can be seen, by way of example, the symbol representing the binary bits (11) is represented by the signal level 714, and similarly, the binary bits (10) are represented by the signal at level 715. This is also shown in the text cited above as the output of a transmit filter with a rectangular filter response.

The present invention can be extended by using a transmit filter having a response 712 as shown in FIG. 7. This results in a biphase pulse or train of pulses such as shown on line 720 for the encoding of the symbol data on line 710.

Referring specifically to the waveform shown on line 720, the encoding of the symbol representing the binary bits (11) is represented by the signal having an amplitude of +3 for the first half of the symbol period (level 721) and a signal having a level of −3 for the second half of the symbol period (level 722). For the next symbol on line 710 representing the binary bits (10), the encoded signal has a level of +1 for the first half of the symbol period as shown by level 723 then a level of −1 for the second half of this second symbol period as shown by level 724. Continuing on, the symbol representing the binary bits (00) is encoded as a signal having a negative −3 amplitude (level 725) for the first half of the third symbol period followed by a level of +3 for the second half of this symbol period as shown by level 726. This continues as shown for each of the symbols on line 710.

It is important to note that the response 712 of the transmit filter results in a signal which has 0 direct current (dc). That is, the amplitude of the positive portion of the signal times its duration is equal to the product of the negative level times its duration. Thus for instance, the cross hatched area 727 is equal to the cross hatched area 728.

While in FIG. 7 each of the symbols are represented by a signal having a transition midway in each symbol period and equal positive and negative amplitudes, this is not necessary. The 0 dc component can also be achieved by, for instance, having a symbol encoded with a signal having an amplitude of +3 for one-fourth of the symbol period and a negative level of −1 for the remaining three-fourths of the symbol period. Additionally, while the embodiment illustrated has a single transition for each symbol period, each symbol can be represented by a signal having more than a single transition in a symbol period. For instance, a symbol can be represented by a signal having a positive +3 level for the first one-eighth of the symbol period, followed by a negative level of −1 for the following three-quarters of the symbol period and ending with a signal having a level of +3 for the last one-eighth of the symbol period. Moreover, more levels (e.g., three positive and three negative levels) may be used to encode symbols representing more than two binary bits each. In every instance discussed above there is no DC component.

Figure 8:
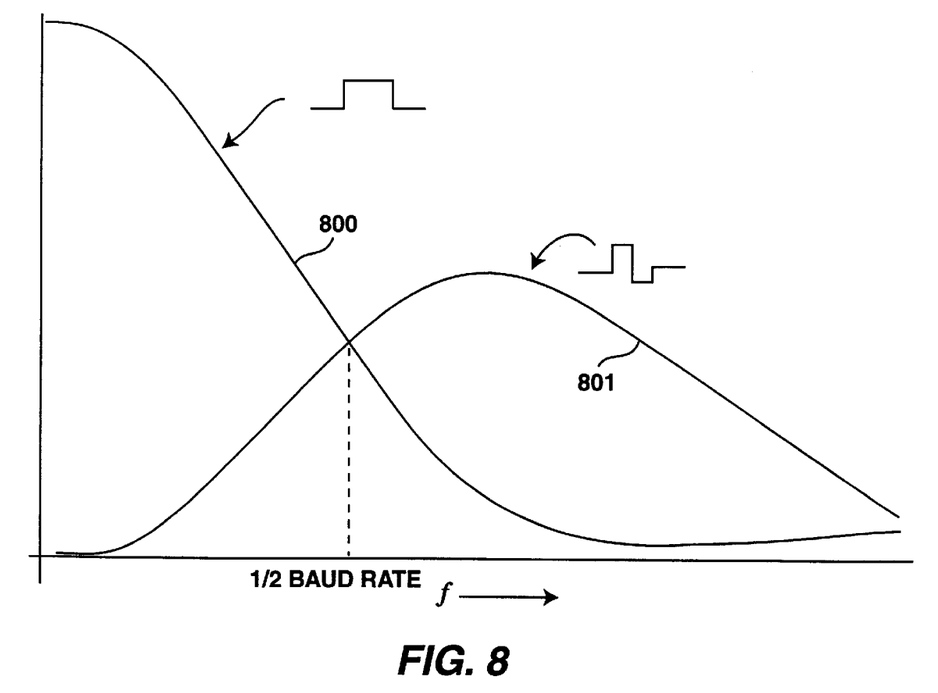
FIG. 8 is a graph used to show an advantage to the embodiment of FIG. 7.

One advance to the encoding of FIG. 7 is shown by the graphs of FIG. 8. The prior art rectangular pulses resulting from the response 711 of FIG. 7 is shown by the curve 800. As can be seen there are substantial low frequency components associated with this prior art encoding technique. In contrast, using the response 712 of FIG. 7, the resultant frequency distribution (represented by curve 801) illustrates that there is a substantial shift of the frequency components to higher frequencies. This has several advantages including the fact that the spectrum is moved away from the voice spectrum allowing voice signals to be more easily transmitted along with the digital data. Importantly, even assuming that there is distortion to the higher frequencies in this shifted spectrum, data recovery is possible from the lower frequencies of the curve 801. This, for instance, makes the data signal less susceptible to some interference such as that caused by an AM radio station.

Figure 9:
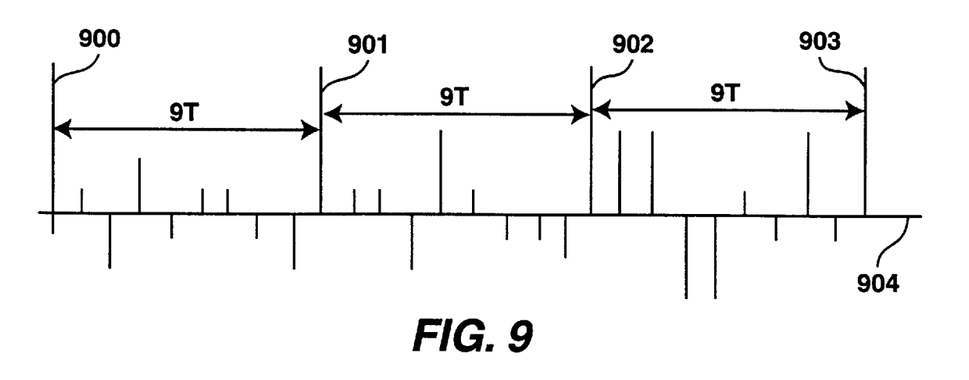
FIG. 9 illustrates a train of data symbols with embedded timing or control symbols.

FIG. 9 illustrates the embedding of a control or timing signal in a symbol (data) stream. The symbols 900–903 are periodically placed into the data symbols. The symbols 900–903 may be of a different amplitude than the other symbols or may make use of the levels used by the used by the data symbols. The symbols on line 904 may be encoded for transmission as discussed above using the filter having the response 712.

The symbols 900–903 may be used at the decoder for clocking, for instance, a phase lock loop. This provides a timing signal that assists in data recovery since, for example, it allows an accurate time window to be generated for data detections.

Thus, a method for encoding and decoding binary data states has been described.

We claim:

1. A method for encoding symbols each occurring during a symbol interval into a signal having at least two different levels of a first polarity and at least two different levels of an opposite polarity to the first polarity, comprising:

receiving a signal representing successive symbols;

generating an encoded signal for each successive symbol which transitions at least once between one of the levels of the first polarity to one of the levels of the opposite polarity, or between one of the levels of the opposite polarity to one of the levels of the first polarity, the transitions and the levels being selected such that the resultant signal for each symbol time has substantially no direct current component.

2. The method of claim 1 wherein the levels for the first polarity are two different positive levels and wherein the levels for the opposite polarity are two different negative levels.

3. The method defined by claim 2 wherein there is a single transition during each symbol interval.

4. The method defined by claim 3 wherein the transition occurs approximately midway into each of the symbol intervals.

5. The method defined by claim 1 wherein timing signals are periodically embedded into the signals representing successive symbols.

* * * * *